United States Patent [19]

Hamley

[11] Patent Number: 4,638,260
[45] Date of Patent: Jan. 20, 1987

[54] AUDIO AMPLIFIER

[76] Inventor: James P. Hamley, 2922 Cottonwood Dr. South, Mill Creek, Wash. 98012

[21] Appl. No.: 652,722

[22] Filed: Sep. 21, 1984

[51] Int. Cl.$^4$ .............................................. H03F 3/45
[52] U.S. Cl. ..................................... 330/254; 330/260; 330/296
[58] Field of Search ............... 330/252, 254, 255, 260, 330/278, 279, 285, 296, 291, 265, 267, 270, 273, 136, 122, 297

[56] References Cited

U.S. PATENT DOCUMENTS

| | | | |
|---|---|---|---|
| 4,223,273 | 9/1980 | Yokoyama | 330/85 |
| 4,360,787 | 11/1982 | Galpin | 330/284 |
| 4,424,493 | 1/1984 | Schroeder | 330/267 |
| 4,439,743 | 3/1984 | Schwarz et al. | 330/267 |
| 4,450,413 | 5/1984 | Fujibayashi | 330/284 |
| 4,498,057 | 2/1985 | Noro | 330/297 |
| 4,502,020 | 2/1985 | Nelson et al. | 330/265 |

Primary Examiner—Gene Wan

[57] ABSTRACT

The input stage to an audio amplifier comprises a complementary-symmetry, differential amplifier pair which drives an intermediate voltage gain stage comprised of a complementary-symmetry, cascode differential amplifier pair. The intermediate stage provides signal drive and bias to the output power amplifier stage, which is preferably a bridged configuration. Control circuitry produces a composite bias signal which is the summation of a static bias signal and a dynamic bias signal. The bias control signal is coupled to the bias control circuit through an optical coupler, and a dynamic class A bias is achieved. Negative feedback for the amplifier is provided by a differential amplifier which has its differential inputs connected to the load terminals, thereby placing any connecting cable between the amplifier and load within the corrective feedback path.

34 Claims, 10 Drawing Figures

AUDIO AMPLIFIER

BACKGROUND OF THE INVENTION

The present invention relates to the signal processing art and, more particularly, to an improved audio amplifier design.

A crucial link in modern high fidelity reproduction systems is the audio amplifier. In a typical installation, the audio amplifier connects between a signal source, such as the preamplified output from a phonograph cartridge, and the loudspeakers. Normally, the amplifier must both voltage and power multiply the input signal in order to drive the loudspeaker to a satisfactory level.

It has been found that listeners can discern various forms of amplifier distortion which, although a small percentage of the reproduced signal, nonetheless constitutes a fatigue inducing irritation. One source of such distortion is clipping induced by input signal levels which drive the amplifier beyond its linear drive region and into saturation of the power output devices. A common approach to combat clipping is to provide very high power amplifiers which are capable of large signal excursions before the output devices driven to saturation. Solid state high power amplifiers are expensive to manufacture due, largely, to the high cost of the high voltage, high power semiconductors which must be employed. Compared to their predecessors, electron tubes, transistors are basically low voltage, high current devices. In addition, they are highly susceptible to permanent damage due to overheating.

High voltage transistors which are capable of handling the power levels required in high power amplifier applications are, thus, difficult to manufacture, resulting in high component cost. In addition, compromises in both gain and bandwidth of high voltage semiconductor devices must be made, in order to achieve the high cost of breakdown voltage rating.

To minimize internal heating of output devices in high power, solid-state amplifiers, the output devices have typically been operated in a class AB mode. A necessary limitation of class AB operation is the production of crossover, or notch distortion as symmetrical push-pull devices make the transition between conducting states. While such notch distortion may be a small percentage of the total signal supplied by the amplifier, it is nonetheless objectionable and fatiguing to listeners.

A further problem with solid state amplifier designs has been the result of stored charge in the base region of the output devices. During turn on of an output device a charge develops which acts to maintain the transistor in its "on" state even though drive current is reduced, or eliminated. The storage effects act to reduce the bandwidth over which transistors can operate, thereby leading to high frequency distortion effects in audio amplifier design and, can significantly increase the internal power produced by a semiconductor, leading to device failure.

To avoid the storage effects suffered by bipolar transistors, many commercial audio amplifier designs employ field effect transistors, such as MOSFETS's for use in the driver and output devices. Such devices are, however, expensive, and often require matched characteristics, further adding to their cost.

A further source of distortion in audio amplifier designs has been due to collector-to-base modulation in the amplifier's voltage gain stage. This modulation, sometimes known as the "Early" effect, can lead to amplifier instability.

Further, in typical installations a connecting cable connects between the output terminals of the amplifier and the input terminals of the loudspeaker. The transmission qualities of the interconnecting cable have been found to affect the fidelity of the overall reproduction system. As such, numerous highly sophisticated and very expensive interconnecting cables are now commercially available.

SUMMARY OF THE INVENTION

The present invention, therefore, is directed to an improved audio amplifier design which overcomes the above noted deficiencies in prior amplifier designs.

Briefly, according to the invention, an audio amplifier comprises an input stage for receiving a signal to be amplified, an intermediate stage for gain amplifying the signal from the first stage, and an output stage, adapted to be coupled to a load, for power amplifying the signal from the intermediate stage. The input stage comprises a complimentary-symmetry, differential amplifier pair, with each differential amplifier having first and second input terminals and first and second output terminals. The signal to be amplified is coupled to the first input terminal of each amplifier in the differential pair. The intermediate stage comprises a complimentary-symmetry, cascode differential amplifier pair, with each intermediate stage amplifier pair having first and second input terminals coupled to the first and second output terminals of one of the input stage differential pairs. Each intermediate stage has first and second output terminals. The output stage comprises a power amplifier connected to at least one of the output terminals from each of the intermediate stage amplifiers for power amplifying the signal therefrom. A feedback circuit couples from the output stage to the second input terminal of each of the input stage differential amplifiers for applying a feedback signal thereto.

In one aspect of the invention, the intermediate stage further comprises first and second output bias circuits, the first output bias circuit being coupled between the first output terminals of the intermediate stage differential pair and the second output bias circuit being coupled between the second output terminals of the intermediate stage differential pair. The output stage includes first and second symmetrical output pairs, each output pair having a pair of inputs and an output. The output stage first symmetrical output pair has each of its inputs coupled to one of the first output terminals of the intermediate amplifier pair. The output stage second symmetrical output pair has each of its inputs coupled to one of the second output terminals of the intermediate pair. The first output bias cirucit determines the bias current in the first symmetrical output pair, and the second output bias circuit determines the bias current in the second symmetrical output pair.

In a further aspect of the invention, each symmetrical output pair output is adapted to be coupled to one of the terminals of the load to be driven. The feedback circuit then comprises the differential amplifier having a pair of differential inputs and an output. Each of the differential inputs is adapted to be coupled to one of the terminals of the load, with the differential output being coupled to each of the second input terminals of the input stage differential amplifier pair.

For applications wherein the power output stage is connected to the load through a connecting cable, the feedback circuit preferably further comprises a wire pair for connecting each of the differential inputs of the feedback circuit differential amplifier directly to the terminals on the load, whereby the connecting cable is within the feedback path of the audio amplifier.

In yet a further aspect of the invention, each of the output stage symmetrical pairs is coupled to the outputs from the intermediate stage thru a symmetrical driver circuit. The symmetrical driver circuit responds to a signal from the intermediate stage to controllably provide both positive and negative drive current to the output stage symmetrical pair. The symmetrical driver circuit is, preferably, biased for class A operation.

In a further aspect of the invention, the output bias circuits comprise a means for setting a static bias level, means responsive to the level of the signal to be amplified to provide a dynamic bias level, means for combining the static and dynamic bias levels to produce a composite bias level, and means for coupling each of the composite bias levels to each corresponding symmetrical output pair for controlling the bias current thereof.

The composite bias signal is produced, preferably, such that each corresponding symmetrical output pair is biased for dynamic class A operation, such that each output device in the output pair conducts a minimum level bias current above the current being delivered to the load for all input signal levels.

An analog embodiment of the bias circuit control includes an absolute value detector for producing a dynamic bias level related to the absolute value of the signal to be amplified, and a fixed bias means for setting a static bias level. A summing circuit sums the dynamic bias level and the static bias level to produce the composite bias level for use as the bias control signal.

In the prefered digital embodiment of the bias circuit control, a digital memory is provided for storing digital commands and data. A processing unit is responsive to the digital memory for executing succesive commands. A provided sample and hold circuit is responsive to control signals from the processing unit to store instantaneous analog levels of the input signal to be amplified. An analog-to-digital converter is responsive to control signals from the processing unit to convert each of the sample and hold circuit instantaneous stored analog levels to a corresponding digital signal. A digital-to-analog converter is responsive to digital output signals produced under the output signals to corresponding analog signals. The processing unit produced digital output signals are predeterminedly related to the instantaneous stored analog levels such that the digital-to-analog converted signals comprise the control signals representative of a commanded bias level.

The bias control signal is, preferably, coupled to the bias determining circuit through an optical coupler.

DETAILED DESCRIPTION

Figure 1:
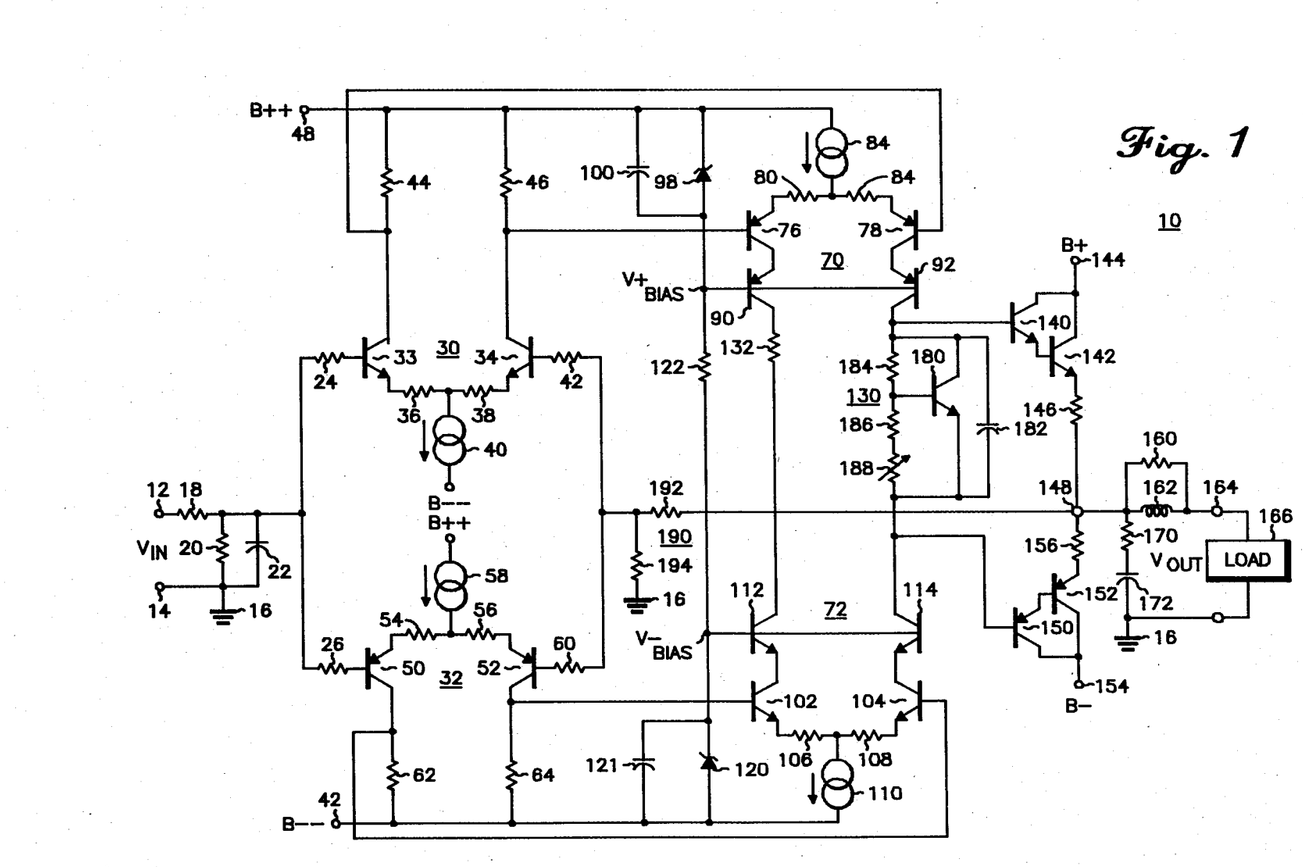
FIG. 1 is a detailed schematic diagram illustrating one embodiment of the audio amplifier according to the invention wherein a single ended output stage is utilized.

FIG. 1 is a detailed schematic diagram of a preferred embodiment of the present audio amplifier, employing a single-ended power output stage. The signal to be amplified "$V_{IN}$" is applied at the input terminals 12, 14 of the amplifier, indicated generally at 10. Terminal 14 connects to circuit ground 16. The input signal is passed through a voltage divider, comprised of first and second resistors 18, 20 with the free end of resistor 20 being connected to the ground node 16. The purpose of the resistors 18, 20 is to provide a resistive buffer between the amplifier input and the output from the previous stage (not shown). A capacitor 22 shunts resistor 20, and is selected of a capacitance to shunt high frequency input signals such as radio frequency interference to ground.

The input signal is then passed through series resistors 24, 26 to a pair of complimentary-symmetry differential amplifiers, indicated generally at 30, 32 respectively. The first differential amplifier 30 is comprised of first and second NPN transistors 33, 34. The emitters of transistors 33, 34 connect through a pair of resistors 36, 38, respectively to a constant current source 40 whose remaining end connects to the negative high voltage terminal (B− −) 42. The resistors 36, 38 provide degeneration to the amplifier 30 and tend to equalize the characteristics of the transistors 33, 34 and linearize the amplifier 30. The constant current source 40 may be comprised of any standard configuration, including a field effect transistor diode, a bipolar transistor current source, or a monolithic current source such as National Semiconductor part number LM 334. The current produced by current source 40 is, in the wellknown manner, selected to optimize the linearity and noise characteristics of the amplifier 30.

The input signal is also passed through the series resistor 24, to the base terminal of the first transistor 33 in amplifier 30. A feedback signal, described herein below, is passed through a series resistor 42 to the base terminal of transistor 34 and amplifier 30.

The collectors of the transistors 33, 34 connect through load resistors 44, 46, respectively, to a source of positive high voltage (B++) 48. Preferably, the value of resistor 44 equals the value of resistor 46 whereby the power dissipation in transistors 33, 34 is approximately equal causing the temperature characteristics of the two transistors 33, 34 to cancel. The resistance of resistors 44, 46 is, along with the value of current provided constant current source 40, selected to bias the next amplifier stage, as described below. Also, the value of resistors 44, 46, along with the values of resistors 36, 38 determine the open loop gain of amplifier 30.

Differential amplifier 30 operates in the well known manner to produce a differential output signal at the collectors of transistors 33, 34, which differential output signal is equal to a gain factor times the difference between the signals applied at the bases of transistors 33, 34. Such amplifiers, in the well known manner, provide a high degree of common mode signal rejection.

The second differential amplifier 32 is comprised of first and second PNP transistors 50, 52 which are, preferably, selected to exhibit complimentary characteristics to the transistors 33, 34. The emitters of transistors 50, 52 connect through emitter degeneration resistors 54, 56, respectively, to a constant current source 58 having a free end which connects to the positive high voltage source 48. As with resistors 36, 38 of amplifier 30, the emitter resistors 54, 56 of amplifier 32 are selected to linearize amplifier operation. Also, the level of current provided by current source 58 is selected to operate amplifier 32 in a linear region, while providing low noise characteristics.

The input signal is passed through a series resistor 26 to the base of transistor 50. Whereas the feedback signal, described below, is passed through a series resistor 60 to the base of transistor 52.

The collectors of transistors 50, 52 connect through load resistors 62, 64 respectively to the source of negative high voltage (B— —) 42. The values of resistors 62, 64, along with the level of current provided by current source 58 are selected to provide DC bias to the subsequent amplifier stage, as described below. Also, the values of resistors 62, 64, 54, 56 are selected to define the differential gain of amplifier 32.

In prior art audio amplifier designs, the output signals from the input amplifiers, such as amplifier 30, 32, are fed to a common emitter configured transistor gain stage. These stages are characterized by one or more transistors whose collectors swing the full voltage developed by the amplifier. A problem with such prior designs is that the signal at the collector of the transistor can modulate the signal appearing at the transistor's base. This phenomonon, known as the "Early" effect, not only produces distortion, but can also lead to amplifier instability. In addition, the slew rate of the amplifier can be limited by this effect.

To minimize, or eliminate collector modulation effects in the present amplifier's voltage gain stage, a complimentary-symmetry, cascode amplifier pair is employed. Refering to FIG. 1, the first cascode amplifier pair is indicated generally at 70, with the symmetrically oriented, complimentary cascode differential pair being indicated generally at 72. Amplifier 70 includes first and second, differentially connected PNP transistors 74, 78, respectively. The emitters of transistors 76, 78 connect through emitter degeneration resistors 80, 82, respectively to a constant current source 84 which connects to the positive high voltage supply 48. Transistors 80, 82 are selected to linearize the operation of the amplifier 70. Constant current source 84 sets the current through the legs of the amplifier 70 as well as providing a high common mode input resistance to reject common mode signals.

The bases of transistors 76, 78 connect to the collectors of input transistors 32, 34. Thus, the DC voltages appearing across load resistors 44, 46 in amplifier 30 determine the DC operating potentials of transistors 76, 78.

In cascode with transistors 76, 78 are a pair of PNP transistors 90, 92. Transistor 90 has its emitter connected to the collector of transistor 76, whereas transistor 92 has its emitter connected to the collector of transistor 78. The bases of the cascode transistors 90, 92 connect to a DC bias source, $V_{BIAS}{}^+$. The DC voltage level $V_{BIAS}{}^+$ is determined by the value of a zener diode 98 having its cathode connected to the positive high voltage source 48 and its anode connected to the bases of transistors 90, 92. A capacitor 100, in shunt with zener diode 98 tends to stabilize the voltage $V_{BIAS}{}^{30}$, as well as reduce zener noise.

The second cascode differential amplifier 72 includes first and second NPN transistors 102, 104 respectively. Transistors 102, 104 have their emitters connected through emitter degeneration resistors 106, 108, respectively, to a constant current source 110, having a free end which connects to the source of negative high voltage 42. The bases of transistors 102, 104 connect to the collectors of transistors 50, 52, whereby the voltage drop across collector resistors 62, 64 determines the DC bias on transistors 102, 104.

In cascode with transistors 102, 104 are a second pair of NPN transistors 112, 114. The emitter of transistor 112 connects to the collector of transistor 102, whereas the emitter of transistor 114 connects to the collector of transistor 104. The bases of transistors 112, 114 are connected to a source of fixed negative bias $V_{BIAS}{}^-$ which is determined by the value of a zener diode 120 having its anode connected to the negative high voltage source 42, and its cathode connected to the bases of transistors 112, 114. A capacitor 121 in shunt with zener diode 120 tends to stabilize the DC voltage $V_{BIAS}{}^-$ and filter zener produced noise. To provide bias current to the two zener diodes 98, 120, a resistor 124 connects from the anode of zener diode 98 to the cathode of zener diode 120.

The collectors of transistors 92, 114 connect to a bias circuit, indicated generally at 130, which is described more fully hereafter. The collectors of transistors 90, 112 connect to the free ends of a resistor 132. Resistor 132 is selected to provide approximately the same voltage drop provided by the bias circuit 130, whereby the power dissipation in transistors 90, 112 is approximately equal to the power dissipation in transistors 92, 114, respectively. In this way, the amplifiers 70, 72 are relatively free of differential drift due to temperature effects.

In operation, a signal applied to the input terminals 12, 14 creates differential outputs from amplifiers 30, 32, which differential outputs are applied as input drive to the cascode configured voltage gain amplifiers 70, 72. The amplified input signal will appear at the collectors of transistors 92, 114. The collectors of transistors 90, 112 carry an inverted, gain multiplied version of the input signal. Of considerable import is the fact that the cascode configuration prevents "Early" effect induced distortions and instabilities. That is, the input signals to amplifier 70 which appear at the bases of transistors 76, 78 are not affected by collector modulation due to the fact that their collectors are fixed biased one diode juntion drop above the bias signal $V_{BIAS}{}^+$. Similarly, the gate inputs to transistors 102, 104 do not suffer collector modulation due to the fact that their collectors are tied to a fixed DC bias which is one diode junction drop below the negative bias source $V_{BIAS}{}^-$.

In the single-ended output configuration of FIG. 1, the collector of transistor 92 connects to the base of an NPN driver transistor 140. Driver transistor 140 is connected in a Darlington configuration with an NPN output power transistor 142. The collectors of the transistors 140, 142 are tied together and connected to a positive low voltage source (B+) 144. The emitter of output transistor 142 connects through a degeneration resistor 146 to a node 148.

The collector of transistor 114 connects to the base of PNP transistor 150. Driver transistor 150 is connected in Darlington configuration with a PNP power output transistor 152. The common collector connections of the transistors 150, 152 connnect to a negative low voltage bias source (B−) 154. The emitter of power output transistor 152 connects through a degeneration resistor 156 to the node 148. Node 148 connects through a filter, comprised of a parallel connection of a resistor 160 and an inductor 162 to the output terminal 164 of the amplifier. A load 166, such as a loudspeaker, connects to terminal 164 and to the amplifier ground terminal 16. Inductor 162 is selected to prevent damage to the power output transistors 142, 152 due to a capacitive load 166. Resistor 160 is selected to damp the ringing of inductor 162. Also, a series connected resistor 170 and capacitor 172 connect from node 148 to amplifier ground 16. The values of resistor 170 and capacitor 172 are selected such that at high frequencies a fixed load, comprised essentially of resistor 170, appears at the amplifier output to assure amplifier stability.

The class of operation of the power output stage comprised of transistors 140, 142, 150 152 and resistors 146, 156, is determined by the DC bias provided by the bias network 130. Bias network 130 is comprised of NPN transistor 180 which has its collector connected to the base of PNP driver transistor 140 and its emitter connected to the base of PNP driver transistor 150. Thus, the collector to emitter voltage of transistor 180 determines the idling current and, therefore, the class of operation of the power output stage transistors. A capacitor 182 connects across the collector to emitter terminals of bias transistor 180 to provide a bypass for normal AC signals.

The collector to emitter voltage of transistor 180 is determined by a resistor 184 connected between the base and collector of transistor 180, and series connected resistor 186 and potentiometer 188 which connect between the base and emitter of transistor 180. Since the base to emitter voltage drop of transistor 180 is approximately constant (0.6 volts for a silicon transistor) a constant current is drawn through resistor 186 and potentiometer 188. This constant current, but for base current into transistor 180, which is normally negligible, determines the voltage drop across resistor 184 and thus the collector to base drop across transistor 180. In this way, potentiometer 188 can be varied to determine the idling current which passes through the power output devices 142, 152 and, in this way, the class of operation of the power output stage. Normally, transistor 180 is mounted to the same heat sink as transistor 142 or transistor 152 in an attempt to maintain bias current constant despite temperature effects.

Negative feedback to the amplifier is provided by a feedback circuit 190. Feedback circuit 190 includes a series resistor 192 connected between the node 148 and the common connection of the series resistors 42, 60 which couple to the bases of transistors 34, 52. A shunt resistor 194 connects between the common connection of the series resistors 42, 60 and amplifier ground 16. In the well known manner, the gain of amplifier 10 can be reduced to unity for very low input frequency signals by providing an appropriate capacitor (not shown) in series with shunt resistor 194. Similarly, to improve the high frequency response of amplifier 10, a high frequency bypass capacitor (not shown) may be provided in parallel with series resistor 192.

The maximum voltage swing which may be provided by the amplifier 10 is determined by the maximum voltage swing of the collectors of transistors 92, 114. Since the power output transistors 142, 152 merely follow this voltage, dissipation in the output stages 142, 152 is reduced by providing the reduced voltage positive and negative power supplies 144, 154, respectively.

The amplifier design of FIG. 1 is seen to provide a significant advance over amplifier designs of the prior art. First, the collector modulation effect, as described above, is virtually eliminated by the disclosed configuration. Also, inasmuch as the circuit is a true complimentary symmetry differential design throughout, non-linearities of individual transistors or stages are compensated for by the corresponding nonlinearity of an opposite transistor stage. Thus, the disclosed amplifier configuration is extremely linear open loop, not requiring high amounts of negative feedback, (which can lead to transient intermodulation distortion) to reduce distortion levels to a tolerable level.

The topology of FIG. 1 does, however, suffer some of the limitations known to prior art amplifier designs. For example, power output transistors 142, 152 are subject to minority carrier, base storage effects. These effects are similar to those exhibited by an ideal transistor having a capacitor connected between its base and emitter. Referring to NPN output transistor 142, for example, in order to increase the conduction of transistor 142, the driver transistor 140 provides drive current to the base of transistor 142. This drive current must charge the storage "capacitor", whereby the power output transistor 142 tracks the drive signal accurately. For high frequency signals, however, there may be insufficient time to charge this storage "capacitor", resulting in high frequency distortion of the amplifier.

Moreover, whereas driver transistor 140 is capable of charging the storage "capacitor", since it is an unidirectional device it cannot discharge this capacitor. As a result, transistor 142 may not turn off as fast as dictated by the signal at the collector of transistor 92, which leads to amplifier distortion, and also results in excessive dissipation, and ultimate failure of transistor 142. The same analysis applies with respect to driver 150 and output transistor 152.

A second limitation suffered by the configuration of FIG. 1 is that the maximum voltage (and thus maximum power) which can be supplied to the load 166 is defined by the peak to peak voltage swing between the positive low voltage source 144 (B+) and the negative low voltage source 154 (B−). An input signal which requires a larger peak to peak signal will result in clipping of the amplifier output stages and corresponding amplifier distortion. A common approach to minimizing, or preventing, clipping is to build high power amplifiers, which require greater bias voltages 144, 154 to be applied to the output transistors. Transistors, however, as opposed to electron tubes, for example, are high current, low voltage devices. High voltage output transistors are, therefore, expensive to construct, and require tradeoffs, such as high frequency response and current gain, which can degrade amplifier operation.

Figures 4A, 4B:
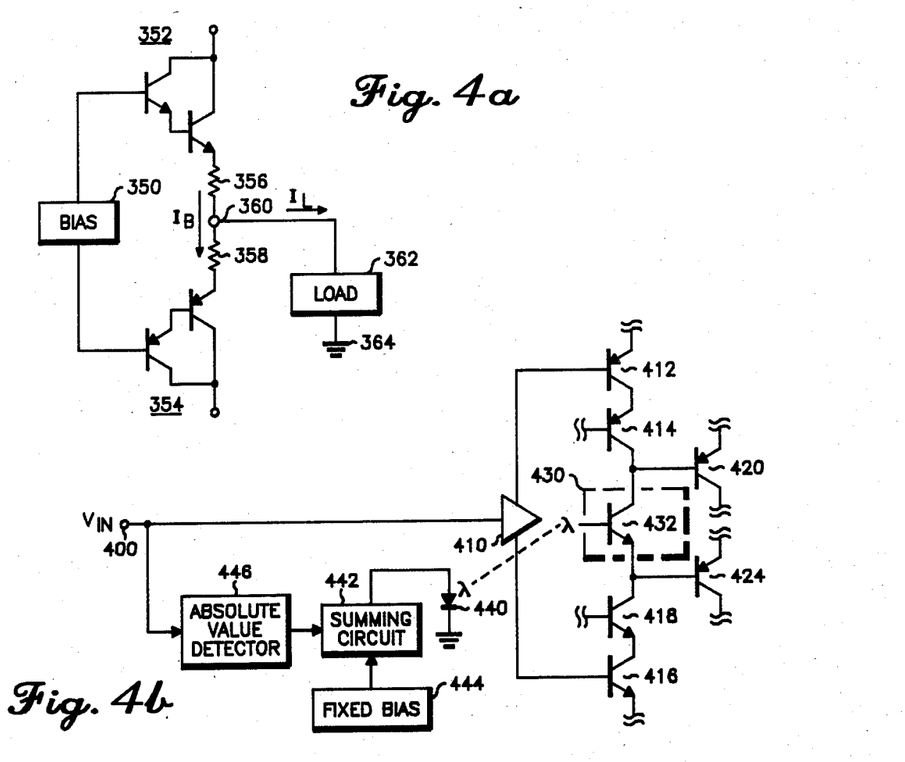
FIG. 4A is a partial schematic diagram illustrating operation of the output stage bias circuit.
FIG. 4B is a schematic diagram, illustrating in block diagram form the dynamic biasing circuit.

Finally, as will be more fully described with respect to FIG. 4A, amplifiers of the type shown with respect to FIG. 1 require a tradeoff between output device quiescent power dissipation and reduced crossover distortion. If the bias circuit 130 is adjusted so that an insignificant current is passed through output transistors 142, 152 in the absence of an input signal, the amplifier will operate class B which will reduce the quiescent dissipation in the output transistors 142, 152 but will also produce a significant amount of crossover distortion. Alternatively, the bias circuit 130 can be adjusted such that sufficient quiescent current is drawn through output transistors 142, 152 such that neither transistor is ever operated in a nonconducting state, i.e. class A operation, to reduce crossover distortion, but the quiescent power dissipation in the output transistors 142, 152 is quite high. As a compromise, designers typically operate the output stage in a class AB mode, wherein a small, but distinct quiescent current is passed through the output transistors in the absence of an input signal.

A further disadvantage to the circuit topology shown in FIG. 1 is that the load 166 is commonly connected to the amplifier output terminals 164, 16 through a significant length of connecting cable. Since the negative feedback for the amplifier is taken from node 148, non-linearities resulting from the use of the connecting cable, or the contacts between the connecting cable and the amplifier, or connecting cable and load are not corrected. This has led to the design of numerous sophisticated high cost connecting cable designs.

Figure 2:
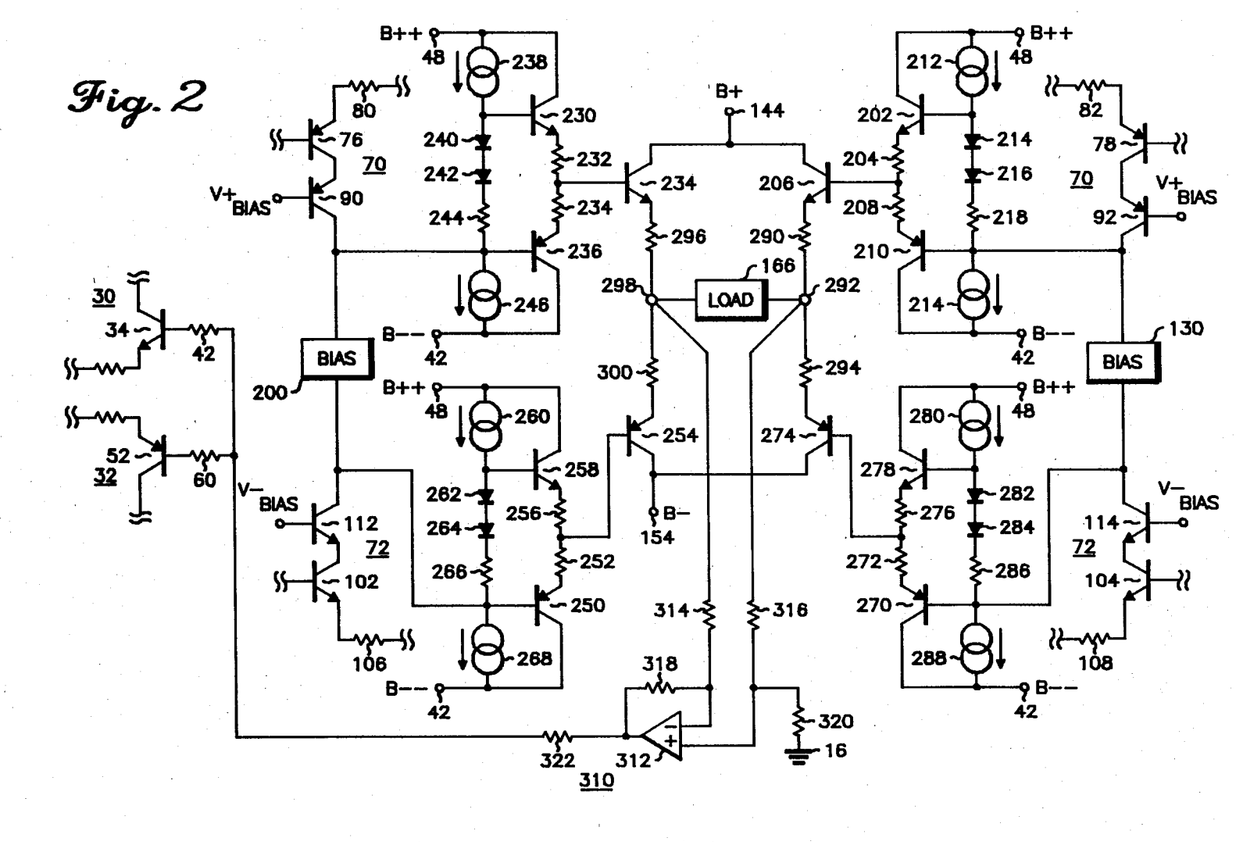
FIG. 2 is a detailed schematic diagram of an alternative embodiment of the invention wherein a double-ended power amplifying stage is employed, as well as class A driver circuitry and a feedback circuit including a differential amplifier.

FIG. 2 is a detailed schematic diagram of an alternate audio amplifier power output and feedback configuration which has been designed to minimize, or eliminate the defects suffered by the topology of FIG. 1, thereby providing enhanced operation.

Refering to FIG. 2, shown is a partial schematic of an improved power output stage and feedback arrangement for use in the basic amplifier design shown in FIG. 1. For purposes of conciseness, only portions of the FIG. 1 circuit are shown. Thus, for example, the modification of FIG. 2 is incorporated within an amplifier design having an input stage including a complimentary symmetry amplifier pair 30, 32 including transistor 34 fed through series resistor 42, and transistor 52, fed through series resistor 60, respectively.

The complimentary symmetry differential pair input stage 30, 32, drives the voltage gain stage, which as shown with respect to FIG. 2, includes a complimentary symmetry, cascode dual differential pair 70, 72, here shown split in half for purposes of illustrating the revised power output stage. The differential pair 70 includes differential PNP transistors 76, 78 having emitter resistors 80, 82, respectively. A PNP transistor pair 90, 92 is in cascode with transistors 76, 78, respectively with transistors 90, 92 having a fixed bias, $V_{BIAS}{}^+$, applied at their base terminals.

The lower differential cascode pair 72 includes NPN transistors 802, 804 having emitter resistors 106, 108, respectively. In cascode with the transistors 102, 104 are NPN transistors 112, 114, respectively, which are fixed bias at their gates by a DC bias $V_{BIAS}{}^-$. The current sources (84, 110 in FIG. 1) are not shown in FIG. 2 but would be provided in an actual embodiment.

As with the FIG. 1 embodiment, the collectors of transistors 92, 114 connect to either side of a bias circuit 130, here shown in block form. Now, however, the collectors of transistors 90, 112 are also connected to either side of a bias circuit 200, which, in actual construction, would be identical to bias circuit 130.

The collector of transistor 92 is applied to the base terminal of a NPN driver transistor 202. One difference between the embodiment of FIG. 1 and the modified embodiment of FIG. 2 is that the power output devices are driven in the FIG. 2 embodiment by class A complimentary symmetry driver stages. Thus, NPN driver 202 connects through an emitter resistor 204 to the base of the NPN power output transistor 206. Also connected to the base of power output transistor 206 is the emitter resistor 208 which connects to a PNP driver transistor 210. The collector of NPN driver 202 connects to the positive high voltage source (B++) 48 whereas the collector of PNP driver 210 connects to the negative high voltage source (B— —) 42. A constant current source 212 connects from the positive high voltage source 48 to the base of NPN driver 202. First and second bias diodes 214, 216, and a bias resistor 218 connect in series from the base of NPN driver transistor 202 to the base of PNP driver transistor 210 and the negative high voltage power supply 42.

The purpose of the first and second constant current sources 212, 214, is to provide a defined bias current to the biasing diodes 214, 216 and the biasing resistor 218. Biasing diodes 214, 216 compensate for the base to emitter voltage of transistors 202, 210, such that the voltage across bias resistor 218 is approximately equal to the voltage across emitter resistors 204, 208. In this way, a defined bias current is provided through the driver transistors 202, 210. For linear operation, the driver transistors 202, 210 should be operated in the class A mode, i.e., the bias current selected sufficiently high such that both driver transistors 202, 210 are conducting over all drive requirements to output power transistor 206.

Similarly, the collector of transistor 90 is connected to the base of NPN driver transistor 230. The emitter of NPN driver transistor 230 connects through an emitter resistor 232 to the base of NPN power output transistor 234. Also connected to the base of output transistor 234 is the emitter resistor 234 which connects to the emitter of PNP driver transistor 236. The collector of NPN driver 230 connects to the positive high voltage source (B++) 48, whereas the collector of PNP driver 236 connects to the negative high voltage source (B— —)42. A first constant current source 238 connects from the positive high voltage source 48 to the base of transistor 230. First and second bias diodes 240, 242 and a bias resistor 244 connect in series from the base of NPN driver transistor 230 to the base of PNP driver transistor 236. A second constant current source 246 connects from the base of PNP driver transistor 236 to the negative high voltage supply 42. Driver transistors 230, 236 are, preferably, biased for class A operation.

The collector of transistor 112 connects to the base of PNP driver transistor 250, whose emitter connects through a resistor 252 to the base of a PNP power output device 254. Also connected to the base of power output transistor 254 is the emitter resistor 256 of a NPN driver transistor 258. The collector of PNP driver transistor 259 connects to the negative high voltage supply (B— —) 42, whereas the collector of NPN driver transistor 258 connects to the positive high voltage supply (B++) 48. The driver transistors 250, 258 are biased for class A operation by means of a first current source 260, which connects between the positive high voltage supply 48 and the base of NPN transistor 258, a series connection of first and second bias diodes 262, 264, and a series bias resistor 266, which connect between the bases of drivers 258, 250 and a second constant current source 268 which connects from the base of driver transistor 259 to the negative high voltage supply 42.

The collector of transistor 114 connects to the base of a PNP driver transistor 270 which connects through a emitter resistor 272 to the base of a PNP power output transistor 274. Also connected to the base of output power transistor 274 is the emitter resistor 276 of a NPN driver transistor 278. The collector of PNP driver transistor 270 connects to the negative high voltage supply 42 whereas the collector of NPN driver transistor 278 connects to the positive high voltage supply 48. The driver transistors 270, 278 are biased for class A operation, through use of a first current source 280 which connects between the positive high voltage supply 48 and the base of NPN driver 278, first and second series connected diodes 282, 284, and series connected bias resistor 286, which connect between the bases of driver transistors 278, 270 and a second current source 288 which connects between the base of PNP driver transistor 270 and the negative high voltage supply 42.

The collectors of the NPN power output transistors 206, 234 both connect to the positive low voltage source (B+) 144, whereas the collectors of the PNP power output transistors 254, 274 both connect to the negative low voltage power supply (B−) 154. The emitter of power output transistor 206 connects through an emitter resistor 290 to a first output terminal 292. First output terminal 292 also connects through an emitter resistor 294 to the emitter of output transistor 274. Similarly, an emitter resistor 296 connects from the emitter of output transistor 234 to a second output terminal 298, which connects through an emitter resistor 300 to the emitter of power output transistor 254. The load, such as a loudspeaker, now connects between the first and second output terminals 292, 298 respectively. The load 166 is, thus, driven in a bridged power output configuration.

By providing complimentary symmetry driver transistors, operating in the class A mode, the circuit of FIG. 2 minimizes storage affects in the power output transistors. Thus, with reference to power transistor 206, its base-emitter storage "capacitor" may be rapidly charged by NPN driver transistor 202 and rapidly discharged by complimentary-symmetry driver transistor 210. In this way, power transistor 206 is capable of linear operation at high frequencies, without the risk of excessive device dissipation due to the inability to turn-off.

A further advantage of the circuit topology shown in FIG. 2 is that the driver and output transistors are current driven rather than voltage driven. The output characteristics of transistors are nonlinearly related to input applied voltage, but linearly related to applied current. Therefore, for linear operation a transistor should be current driven rather than voltage driven. Taking, for example, the power output stage driven from the collector of transistor 92, the driver transistors 202, 210 are seen to be driven from very high impedance sources, i.e. constant current sources 212, 214 and the collector of transistor 92. As such, these devices are current driven. In turn, the impedance at the base of power output transistor 206 is correspondingly current driven through the drivers 202, 210.

By driving the load 166 in the bridged configuration, a high power audio amplifier is realized, without requiring high voltage power output transistors. Inasmuch as power delivered to the load 166 is proportional to the square of the peak signal applied thereto, by going to a bridged configuration the peak signal which can be applied to the load is doubled, resulting in a four times increase in power. Thus, the amplifier configuration of FIG. 2 can utilize relatively inexpensive low voltage power output transistors.

A unique feedback circuit indicated generally at 310 is utilized to provide the feedback signal to the input differential pairs 30, 32. Feedback circuit 310 is comprised of a precision differential amplifier which includes operational amplifier 312 having its inverting input connected through a series resistor 314 to the second output terminal 298, and its noninverting input connected through a series resistor 316 to the first output terminal 292. In standard differential amplifier configuration, a feedback resistor 318 connects from the output of operational amplifier 312 to the inverting input and a shunt resistor 320 connects from the noninverting input of operational amplifier 312 to ground 16. A series resistor 322 connects from the output of operational amplifier 312 to the common connection of the series resistors 42, 60 which feed the negative feedback input to the audio amplifier.

Preferably, the value of resistor 314 is matched to the value of resistor 316 and the value of resistor 318 is matched to the value of resistor 320. In this way the overall gain of the feedback circuit 310 becomes the ratio of resistor 318 to the ratio of resistor 314. Thus, the gain of the audio amplifier, with feedback, may simply be selected as the ratio of these resistors. For example, if the ratio of resistor 318 to resistor 314 is 1:20 then the closed loop gain of the amplifier will be approximately 20°.

The value of resistor 322 is selected to provide DC balance to the differential input pair 30, 32.

Operational amplifier 312 should be selected to exhibit low noise output characteristics and also a frequency response which exceeds that expected of the audio amplifier.

In operation, the feedback circuit 310 will produce an output signal which is equal to the differential signal applied to the load 166. This differential signal is then compared with the input signal, by the input stage 30, 32, in the normal manner to reduce overall amplifier distortion. It is noted that although the operational amplifier 312 will contribute distortion of its own, many commercially available units exhibit vanishingly small distortion levels, whereby the contribution by operational amplifier 312 to overall distortion in the audio amplifier is negligible.

An advantage of the feedback circuit 310 shown in FIG. 2, is that it can be used to compensate for nonlinearities in connecting cable between the amplifier and the load 166. This is better shown with respect to FIG. 3, wherein the input signal to be amplified $V_{IN}$ is shown applied to the input terminals 12, 14 of the audio amplifier, indicated within box 10. The audio amplifier, includes the amplifying gain stages, indicated collectively at 330, which drive output terminals 292, 298. In the normal manner, a connecting cable 334 connects between the output terminals 292, 298 and the input terminals of the load 166. By routing a separate cable pair 336 from the load 166 terminals back to the feedback circuit 310, it is now observed that the connecting cable 334 is within the overall feedback loop. Thus, the feedback circuit 310 will tend to correct for nonlinearities produced by the cable 334, whereby relatively inexpensive cables may be used.

Figure 3:
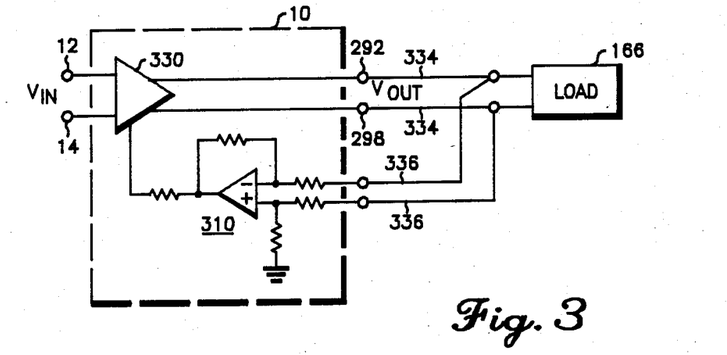
FIG. 3 is a schematic diagram illustrating the preferred amplifier feedback arrangement employing a differential amplifier, wherein the connecting cables between the audio amplifier output and load are included within the feedback path.

In this way, the amplifier is better able to damp ringing or other effects produced by the load 66 which, otherwise, might be isolated from the feedback of a conventional amplifier due to buffering of the connecting cable 334.

Refering again to FIG. 2, a disadvantage of the bridge amplifier power output stage shown is that it exhibits twice the crossover distortion of a single ended output, such as shown in FIG. 2. The most direct way to eliminate crossover distortion is to operate the power output transistors in the class A mode. Class A mode operation implies that the output transistors never turn off, i.e. they conduct current for all input signal conditions. FIG. 4A is a simplified schematic diagram illustrating the relationship between load current $I_L$ and base current $I_B$. Shown is a bias circuit, in block form 350, which provides bias to a Darlington NPN driver and output stage 352, and a PNP Darlington driver and power output stage 354. The emitters of Darlingtons 352, 354 connect through emitter resistor 356, 358, respectively to the amplifier output terminal 360. A load 362 connects from the output terminal 360 to amplifier ground 364. In its quiescent state, i.e., with the output terminal 360 at ground potential, the bias circuit 350 forces a bias current $I_B$ through the Darlington's 352, 354 and their corresponding emitter resistors 356, 358. Now, assuming positive input signal causes the drive to Darlington 352 to increase, a load current $I_L$ will be produced and the voltage at output terminal 360 rises above ground potential. Once this load current $I_L$ equals the quiescent bias current $I_B$, Darlington 354 will tend to turn off, thereby leading to crossover distortion. For standard class A operation, the quiescent current $I_B$ is selected to be higher than the highest possible load current $I_L$, thereby assuring that both Darlingtons 352, 354 are maintained in conductive states at all times. A serious disadvantage to class A operation is, however, the high quiescent power dissipation in the Darlington 352, 354 and the resulting relatively inefficient amplifier operation.

A feature of the present invention is the use of a dynamic class A bias circuit which assures conduction of the output devices for all input signals, yet significantly reduces the quiescent output power device disipation, thereby enhancing amplifier efficiency.

FIG. 4B is a schematic diagram illustrating the preferred analog embodiment of the dynamic class A biasing arrangement. Here, the signal to be amplified $V_{IN}$ is applied to an input terminal 400 which connects to the input of the amplifier input stage, here indicated collectively at 410. The input stage 410 drives the intermediate voltage gain stage, here shown partially as PNP transistor 412 with its cascode PNP transistor 414, and NPN transistor 416, with its NPN cascode transistor 418. The collector of transistor 414 connects to a driver transistor 420, with a collector of transistor 418 connecting to a driver transistor 424. For purposes of conciseness, the complete voltage gain stage and the complete power output stage are not shown in FIG. 4B, these stages either being shown in FIGS. 1 or 2, or any prior art amplifier configuration.

Bias to the bases of transistors 422, 424 is provided by a bias circuit 430. Bias circuit 430 is comprised of a NPN photo transistor 432, having its collector connected to the base of a driver transistor 424. Phototransistor 432 is part of an optical coupler which includes the light emitting diode 440. In the well known manner, current passing through light emitting diode 440 causes light emitting diode 440 to emit light which impinges upon the base of phototransistor 432. This impinging light produces a base current which drives transistor 432. Thus, by controlling the current through light emitting diode 440, the drive to transistor 432 is thereby controlled as is the bias voltage to transistors 420, 424.

Drive to light emitting diode 440 is provided by a summing circuit 442 which provides an output proportional to the summation of a fixed bias signal, provided by fixed bias block 444, and the output from an absolute value detector circuit 446. Absolute value detector circuit 446 receives the input signal $V_{IN}$, and produces an output signal equal to the absolute value of the input signal. For quiescent conditions, i.e., no input signal $V_{IN}$, the fixed bias 444 is used to control the drive to the phototransistor 442, and thereby the bias from bias circuit 430. This quiescent current level can be selected to be much lower than required for class A operation. Now under dynamic conditions, i.e., a varying $V_{IN}$ signal, the drive applied to phototransistor 432 will increase above the fixed bias level in a manner proportional to the increase in input signal level. Thus, as the input signal $V_{IN}$ increases, the bias voltage produced by bias circuit 430 will correspondingly increase such that the bias current dictated by bias circuit 430 will exceed the drive current required to the output power transistors by some nominal amount which assures continuous conductivity of all output power transistors.

The dynamic class A biasing scheme described herein is seen to result in elimination of crossover distortion, as in a conventional class A design, without the quiescent power dissipation and resultant inefficiencies known to conventional class A operation.

Figure 5A:
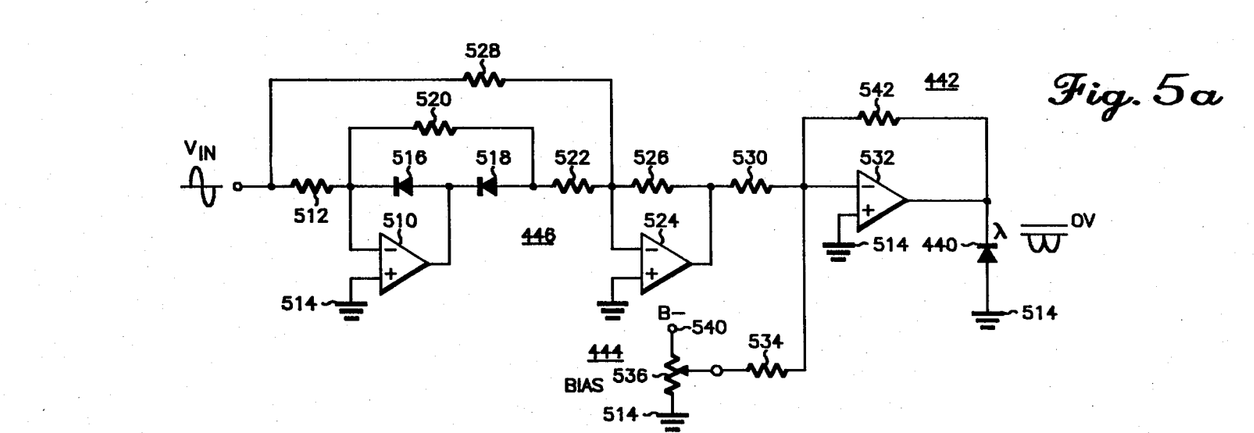
FIG. 5A is a detailed schematic diagram illustrating the preferred embodiment of the dynamic biasing circuit of FIG. 4B, with FIGS. 5B and 5C being alternative embodiments of the bias circuit.

FIG. 5A is a detailed schematic diagram illustrating an embodiment of the analog dynamic bias circuit shown in FIG. 4B. Here, the input signal $V_{IN}$ is shown, for purposes of illustration, as one cycle of a sine wave. This signal is applied to the input of the absolute value detector 446. Absolute value detector 446 is comprised of a precision full wave rectifier circuit. This circuit includes an operational amplifier 510 which has its inverting input connected through a series resistor 512 to the input signal $V_{IN}$. The noninverting input of operational amplifier 510 is connected to ground 514. A diode 516 has its anode connected to the output of operational amplifier 510 and its cathode connected to the inverting input of amplifier 510. The output from operational amplifier 510 is connected to the cathode of a second diode 518, whose anode connects through a feedback resistor 520 to the inverting input of operational amplifier 510. The anode of diode 518 connects through a series resistor 522 to the inverting input of a second operational amplifier 524. The noninverting input of operational amplifier 524 connects to ground 514. The feedback resistor 526 connects from the output of operational amplifier 524 to its inverting input. Also, summing resistor 528 connects the input signal $V_{IN}$ to the inverting input of operational amplifier 24.

For the positive half of the sine wave input signal, $V_{IN}$, amplifier 510 produces a negative signal at its output which reverse biases diode 516 and forward biases diode 518. The positive portion of the sine wave input is, thus, inverted and amplified by a gain factor equal to the ratio of resistor 529 to resistor 512.

The negative portion of the input sine wave $V_{IN}$ produces a positive output from amplifier 510 which forward biases diode 516 and reverse biases diode 518, thereby effectively producing a gain of 0 for the negative portion of the sine wave input signal. Both the full sine wave input signal $V_{IN}$ and the pathway of rectified signal out of operational amplifier 510 are summed in the summing circuit comprised of operational amplifier 524 and summing resistors 526, 522 and 528. These resistors are selected such that added to the input signal $V_{IN}$ is twice the inverted half wave rectified signal out of operational amplifier 510. These two signals sum at the output of amplifier 524 as the full wave rectified signal $V_{IN}$.

The full wave rectified $V_{IN}$ signal appearing at the output of amplifier 524 is summed through a summing resistor 520 into the inverting input of an operational amplifier 532. Also summed through a summing resistor 534 into the inverting input of operational amplifier 532 is a DC bias signal formed by a potentiometer 536 which connnects between ground 514 and a negative bias potential (B−) 540. Negative feedback around operational amplifier 532 is provided by a resistor 542 which connects between the output of operational amplifier 532 and the inverting input. The noninverting input of operational amplifier 532 connects to ground 514. In the normal manner, operational amplifier 532 sums the signals provided through the summing resistor 530, 534 amplifying them by a factor determined by feedback resistor 542. Thus, appearing at the amplifier 532 is the fully rectified signal $V_{IN}$, inverted, and offset from zero volts by a fixed bias level determined by the setting of potentiometer 536.

The output voltage from amplifier 532 is applied to the cathode of light emitting diode 440, whose anode connection is at ground 514.

Thus, as is described with respect to FIG. 4B, the dynamic bias signal provided by the circuit of FIG. 5A includes a DC bias control to establish a quiescent output transistor current level, as well as a dynamic signal which varies the bias signal in response to the input signal such that the bias current level always exceeds the level of the current drawn by the load by an amount which assures that each power output device conducts a minimum level current for all input signal level conditions.

It should be noted that in some applications the voltage applied to the light emitting diode 440 may need to vary in a manner other than directly tracking the absolute value of the input signal level in order to assure dynamic class A operation. In such cases, the desired transfer response between input signal and light emitting diode 40 current can be established empirically, and the gain characteristics of operational amplifier 532 suitably tailored by appropriate feedback elements to match the desired transfer. Further elaboration of the manner by which the feedback to amplifier 532 may be altered to achieve a desired transfer characteristic is unnecessary herein, since such methods are well known to this art.

Figure 5B:
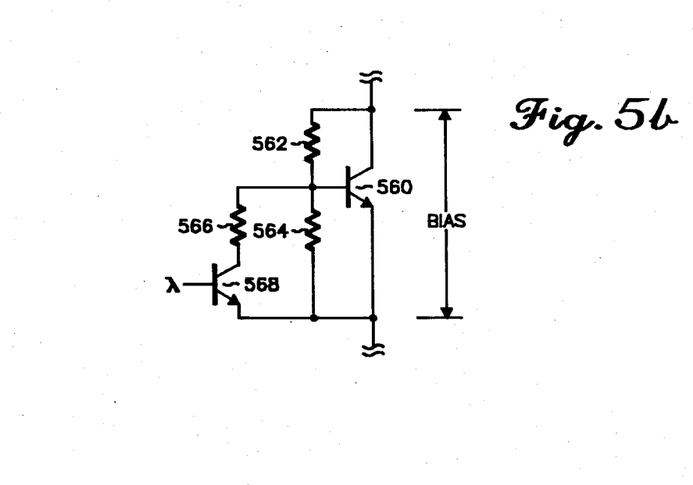
Figure 5C:
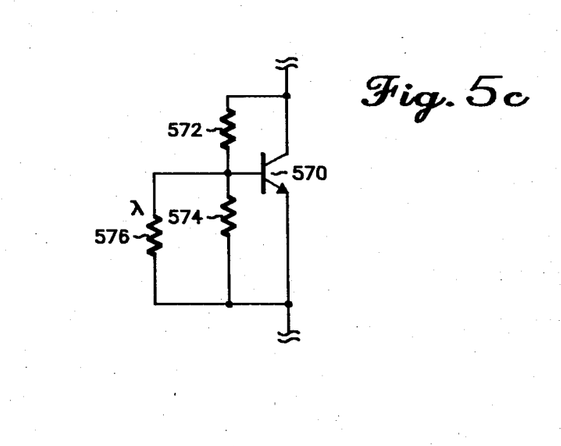

FIG. 5B and 5C illustrate alternative configurations for the bias circuit 430 of FIG. 4B. In FIG. 5B, the principal bias element is a standard NPN transistor 560. A first resistor 562 connects between the collector and base of transistor 560, with a second bias resistor 564 being connected between the base and emitter of transistor 560. In parallel with bias resistor 564 is the series connection of a third resistor 566 and the collector-emitter of a phototransistor 568.

The values of the resistors 562 and 564 are preferably selected such that with photoresistor 568 turned completely off, the bias developed across the collector-emitter of bias transistor 560 is sufficient to bias the power output devices into the class AB mode. Subsequently, light impinging upon the base of transistor 568 (as from the light emitting diode 540 of FIG. 5A) will form a parallel circuit with bias resistor 564, decreasing the resistance thereof, and thereby increasing the collector to emitter bias of transistor 560.

In FIG. 5C, the principal biasing element is a NPN transistor 560 having a first bias resistor 572 connected between its collector and base and a second bias resistor 574 connected between its base and emitter. In this embodiment, however, the optical coupler device employed is comprised of a LED photo transmission device and a photoresistor 576 which connects in parallel with the second bias resistor 574. Photoresistor 576 responds to impinging light by reducing its DC resistance.

The values of the biasing resistors 572, 574 and the photoresistor 576 are selected such that with no light impinging on photoresistor 576 the bias developed across the collector-emitter of bias transistor 570 is just sufficient to provide class AB operation in the output devices. Input signals which require increased dynamic bias on the output transistors will result in light being coupled to the photoresistor 576, reducing the resistance thereof, and correspondingly increasing the bias voltage across transistor 570.

It is noted that in either of the bias circuits shown in FIGS. 5B, 5C the principal bias transistor (560, 570, respectively) may, in a conventional manner, be mounted to the heat sinks for the output devices, thereby allowing the bias circuit to track thermal effects in the output power stage.

Also, for circuit topologies such as that of FIG. 2 wherein two bias circuits must be provided, the bias control circuit of FIG. 5A can be made to drive a second light emitting diode, and a second bias circuit, such as is shown in FIGS. 5B and 5C.

Figure 6:
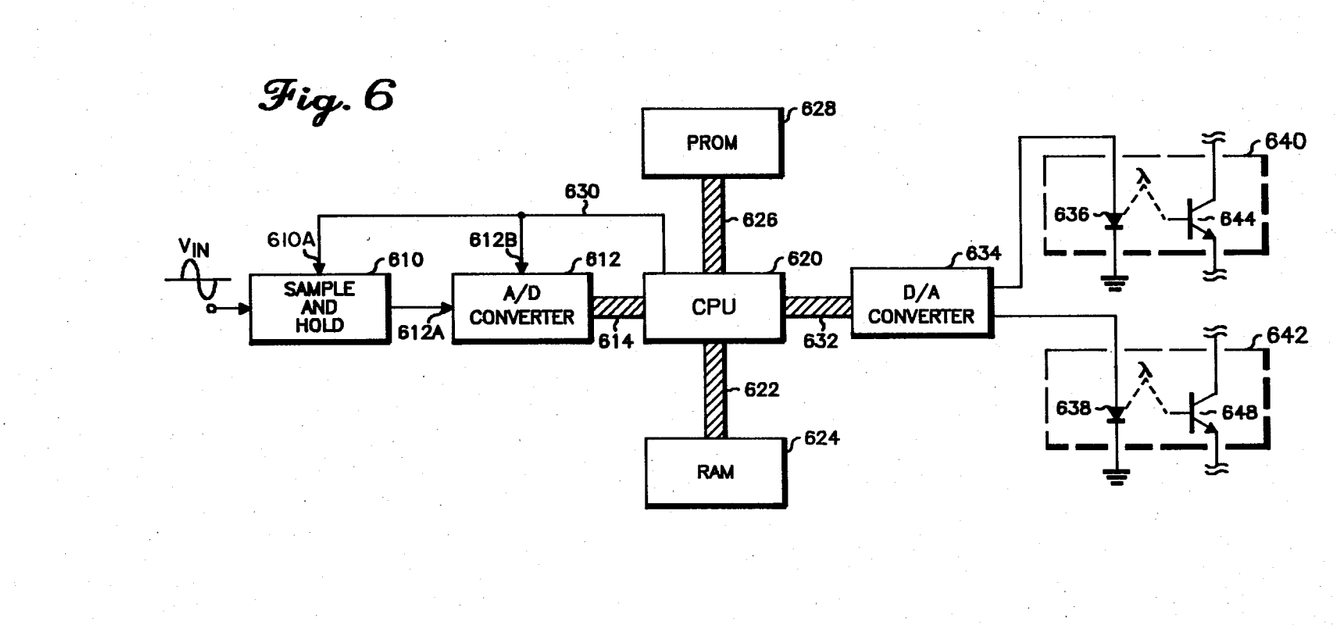
FIG. 6 is a block diagram illustrating the preferred digital microprocessor controlled embodiment of the dynamic biasing circuit.

FIG. 6 is a block diagram illustrating an alternative embodiment of the bias control circuit which employs a digital processor.

Referring to FIG. 6, the input signal $V_{IN}$ is passed to the input of a sample and hold circuit 610. Sample and hold circuit 610 responds to a control signal at a control input 610A to store the instantaneous analog level of the input signal $V_{IN}$.

This stored analog sample is passed to the input 612A of an analog-to-digital converter 612. Analog-to-digital converter 612 responds to a control signal at its control input 612B to convert the analog stored level into a corresponding multi-bit digital signal. This digital signal is coupled over a multiline bus 614 to a central processing unit 620. Central processing unit 620, which may comprise a conventional microprocessor, connects via a multiline bus 622 to associated random access memory (RAM) 624. Further, central processing unit 620 connects over a multiline bus 626 to an associated programmable read only memory (PROM) 628.

A control output line 630 from the central processing unit 620 connects to the control input 610A, 612B of the sample and hold circuit 610 and the analog-to-digital converter 612, respectively.

A multiline bus 632 connects from the output of the central processing unit 620 to the input of a digital-to-analog converter 634. The analog signals produced at the output of digital-to-analog converter 634 connect to the anodes of a pair of light emitting diodes 636, 638 which are included within a pair of optical couplers 640, 642, respectively. A pair of phototransistors 644, 648, included within optical couplers 640, 642, respectively, are used to bias the output devices of an amplifier, such as the amplifier shown in FIG. 2.

Figure 7:
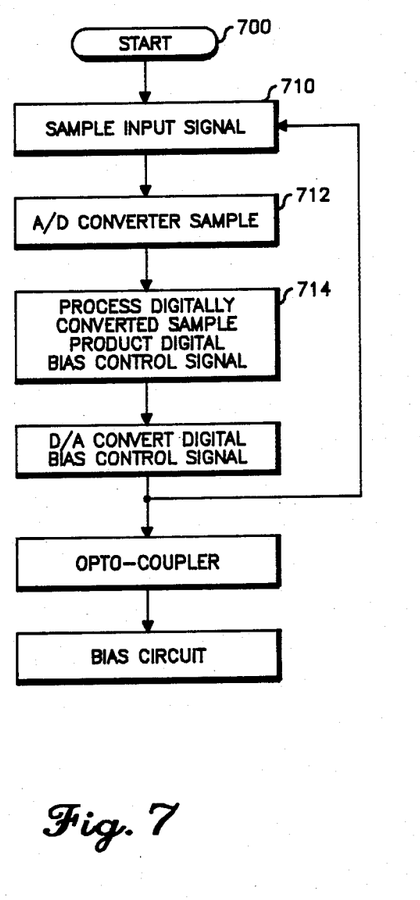
FIG. 7 is a logic flow diagram illustrating the sequential steps executed by the microprocessor of FIG. 6 in performing the dynamic biasing operation.

Operation of the digital bias control circuit of FIG. 6 is better understood with reference to FIG. 7, which is a flow chart illustrating the sequential steps performed by the central processing unit 620 to precisely control the bias level. The sequential commands to be executed by the central processing unit are stored within the RAM 624. Thus, at 700, the processing systems starts. First, the central processing unit 620, via control line 630, causes the sample and hold circuit 610 to store a sample of the input analog signal at block 710. Then, at block 712, the central processing unit 620 sends a command signal over control lines 630 to the control input 612B of the analog-to-digital converter 612, causing the converter 612 to convert the stored analog signal out of sample and hold 610 into a corresponding digital signal which is output on bus 614.

At block 714, the central processing unit 620 processes the digitally converted analog level signal, to produce a digital signal on the output bus 632 which is representative of a required bias control signal level.

Either of two techniques can be readily employed by the central processing unit 620 to produce the digital bias control signal. These approaches include either a "curve fitting" approach or a "look-up" table approach. In the curve fitting approach, the central processing unit 620 essentially inserts the digital analog signal level into an equation which allows calculation of the desired required digital bias control signal. This equation can be, for example, stored in the PROM 628 which equation is applicable to any amplifier, or the equation could be generated via empirical data taken on a particular amplifier and stored in the PROM 628. Using well known techniques, the central processing unit 620 can be made to fit a curve to the empirically stored data points, and thereby generate an equation for the required digital output signal for a given digital analog signal level.

In the "look-up" approach, a series of empirical data points can be taken for a particular amplifier documenting the required bias control level to produce a given output transistor bias current. These data points are then stored in the PROM 628, such that upon receipt by the central processing unit 620 of a signal level, the central processing unit 620 produces the corresponding bias control signal level as dictated by the "look-up" table in PROM 628.

Variations in component tolerances for the devices used in the audio amplifier may cause a distinct spread in the bias control signal levels required to maintain a desired dynamic bias mode. Thus, it is contemplated that for each empirical data establishing the required bias control signal levels to produce a desired bias level can be taken, either by manual or automatic means, with this data being loaded into the PROM 628 for that particular amplifier. In this way, each amplifier off of a line will operate within a tight tolerance of a desired dynamic bias specification.

The digital bias control signal produced at output bus 632 from the central processing unit 620 is converted, in the known manner by the digital-to-analog converter 634 into an appropriate analog signal for application to the optical couplers 640, 642 to thereby control output stage bias as discussed herein above. It should be noted that wherein more than one bias circuit is used, such as the embodiment FIG. 2, empirical data can be taken for the output stages associated with each bias circuit, such that the analog signals produced by the digital-to-analog converter 634 are unique for each optical coupler 640, 642, thereby compensating for component tolerance differences between the two biased output stages.

It will be appreciated that in a practical embodiment of the digital embodiment shown in FIG. 6, the central processing unit 620 would typically be connected to the analog-to-digital converter 612, RAM 624, digital-to-analog converter 634 and PROM 628 by simply a data-/address bus or by two buses, one for the transfer of data and the other for addressing. Also, it will be appreciated that in an actual embodiment of FIG. 6 design, the control line 630 may also be conveniently comprised of one or more lines from an address bus.

Additionally, the central processing unit 620 could receive sense signals from thermal sensors mounted to sense the operating temperature of the power output devices and, through appropriate PROM programming, vary the bias level to compensate for thermal effects. Further, the processing unit 620 could monitor current and voltage in the output devices and provide for output device protection, such as safe-area limiting.

In summary, various embodiments of an improved audio amplifier design have been described in detail. The improved design minimizes or eliminates many of the shortcomings suffered by audio amplifier designs known to the prior art. For example, collector modulation distortion (the "Early" effect) in the voltage gain stage has been eliminated through the use of a cascode circuit. Storage effects in the power output devices, which can lead to poor high frequency performance and/or output device failure, have been significantly reduced through the use of complimentary symmetry, class A bias driver circuits. Further, a high power amplifier design which employs relatively low voltage power output transistors has been disclosed. A disclosed dynamic biasing circuit, which may be implemented in either analog or digital form, allows biasing the output devices in a dynamic class A mode, eliminating crossover distortion yet minimizing output device dissipation and thereby increasing power amplifier efficiency. In addition, a novel feedback circuit configuration has been disclosed which, inter alia, allows the connecting cable between the amplifier output and the load to be included within the feedback loop, thereby assuring that the negative feedback corrected amplifier output is applied directly to the load terminals.

Further, it is noted that the disclosed audio amplifier topology is fully complimentary, symmetry and balanced throughout, resulting in an amplifier design which exhibits very low open loop distortion. As such, negative feedback may be reduced to thereby avoid the risk of transient intermodulation distortion.

Whereas preferred embodiments of the invention have been described in detail, it is apparent that many modifications and variations thereto are possible, all of which fall within the true spirit and scope of the invention.

For example, the digital dynamic processor described with respect to FIGS. 6 and 7 could include, stored in PROM 628, a program which would cause the CPU 620 to generate output test signals which, when converted to analog signals by digital-to-analog converter 634 and coupled through appropriate switching (not shown) to the input of the audio amplifier, could be used to determine the bias level required to assured class A operation but minimize output device dissipation. These bias levels would then be stored, as in RAM 624, and used for bias control as described above, for normal operation of the amplifier. The test sequence could be activated by a user control or automatic testing could be provided. In this way, the bias system would "update" as necessary to correct for component changes or other variables.

I claim:

1. An audio amplifier comprising:
an input stage for receiving a signal to be amplified;
an intermediate stage for gain amplifying the signal from the input stage; and,
an output stage, adapted to be coupled to a load, for power amplifying the signal from the intermediate stage,
wherein said input stage comprises a complementary-symmetry, differential amplifier pair, each differential amplifier having first and second output terminals, said signal to be amplifier being coupled to the first input terminal of each of said amplifiers;
wherein said intermediate stage comprises a complementary-symmetry, cascode differential amplifier pair, each intermediate stage amplifier pair having first and second input terminals coupled to the first and second output terminals of one of said input stage differential pairs, and each intermediate stage having first and second output terminals;
wherein said output stage comprises power amplifier means connected to at least one of said output terminals from each of said intermediate stage amplifiers for power amplifying the signal thereon; and
a feedback circuit coupled from said output stage to the second input terminal of each of said input stage differential amplifiers for applying a feedback signal thereto.

2. The audio amplifier of claim 1 wherein:
said intermediate stage further comprises first and second output bias circuits, said first output bias circuit being coupled between the first output terminals of said intermediate stage differential pair and said second output bias circuit being coupled between the second output terminals of said intermediate stage differential pair; and
said output stage includes first and second symmetrical output pairs, each output pair having a pair of inputs and an output, said output stage first symmetrical output pair having each of its inputs coupled to one of the first output terminals of said intermediate amplifier pair, said output stage second symmetrical output pair having each of its inputs coupled to one of the second output terminals of said intermediate pair, with said first output bias circuit determining the bias current in said first symmetrical output pair and said second output bias circuit determining the bias current in said second symmetrical output pair.

3. The audio amplifier of claim 2 wherein:
each symmetrical output pair output is adapted to be coupled to one of the terminals of the load to be driven; and
wherein said feedback circuit comprises a differential amplifier having a pair of differential inputs and an output, each of said differential inputs adapted to be coupled to one of the terminals of said load, said differential amplifier output being coupled to each of the second input terminals of said input stage differential pair.

4. The audio amplifier of claim 3 wherein:
said output stage is adapted to be connected to said load through a connecting cable; and
wherein said feedback circuit further comprises a wire pair for connecting each of said differential inputs directly to the terminals on said load, whereby said connecting cable is within the feedback path of said audio amplifier.

5. The audio amplifier of claim 2 wherein
each of said output stage symmetrical pairs couples to the outputs from said intermediate stage through a symmetrical driver circuit, said symmetrical driver circuit responding to a signal from said intermediate stage to controllably provide positive and negative drive current to said output stage symmetrical pair.

6. The audio amplifier of claim 5 wherein each of said symmetrical driver circuits is biased for class A operation.

7. The audio amplifier of claim 1 wherein said output stage is coupled to each of said intermediate stage output terminals through a symmetrical driver circuit which responds to signals from said intermediate stage to controllably provide positive and negative drive current to said power amplifier means.

8. The audio amplifier of claim 7 wherein each of said symmetrical driver circuits is biased to class A operation.

9. The audio amplifier of claim 2 wherein:
said first and second output bias circuits include means for biasing said first and second symmetrical output pairs for class A operation.

10. The audio amplifier of claim 1 wherein:
said intermediate stage further comprises bias means for controlling the bias of said output stage.

11. The audio amplifier of claim 10 wherein:
said bias means includes:
means for setting a DC bias level;
means for producing a dynamic bias level signal responsive to the level of the signal to be amplified; and
means for combining said DC bias level and said dynamic bias level signal and controlling the bias of said output stage responsive to said combined bias level.

12. The audio amplifier of claim 11 wherein:
said combined bias level biases said output stage for dynamic class A operation such that each output device conducts a minimum bias current above the current being delivered to the load for all input signal levels.

13. The audio amplifier of claim 2 wherein:
each of said output bias circuits comprises:
means for setting a static bias level;
means responsive to the level of the signal to be amplified to produce a dynamic bias level;
means for combining said static and dynamic bias levels to produce a composite bias level; and means for coupling each of said composite bias levels to each corresponding symmetrical output pair for controlling the bias current thereof.

14. The audio amplifier of claim 13 wherein:
said composite bias signal is produced such that each corresponding symmetrical output pair is biased for dynamic class A operation such that each output device in the output pair conducts a minimum level bias current above the current being delivered to the load for all input signal levels.

15. The audio amplifier of claim 13 wherein said means for producing a dynamic bias level includes absolute value detector means for detecting the absolute value of the input signal to be amplified.

16. The audio amplifier of claim 2 wherein:
each of said bias circuits includes a photo responsive element and wherein the bias level produced by each of said bias circuits is a function of the status of said photo responsive element; and wherein said bias circuits include control means for producing a control signal representative of a commanded bias level, each said bias cirucit further including phototransmission means for transmitting light to said photo responsive element as a predetermined function of said control signal.

17. The audio amplifier of claim 16 wherein said bias circuit control means comprises:
an absolute value detector for producing a dynamic bias level related to the absolute value of the signal to be amplified;
a fixed bias means for setting a static bias level; and
summing circuit means for summing said dynamic bias level and static bias level to produce a composite bias level for use as said control signal.

18. The audio amplifier of claim 17 wherein:
said photo responsive element and said phototransmission means are comprised of an optical coupler.

19. The audio amplifier of claim 16 wherein said bias circuit control means comprises:
digital memory for storing digital commands and data;
a central processing unit responsive to said digital memory for executing successive commands;
a sample and hold circuit responsive to control signals from said central processing unit to store instantaneous analog levels of the input signal to be amplified;
analog-to-digital converter means responsive to control signals from said central processing unit to convert each of said sample and hold circuit instantaneous stored analog levels to a corresponding digital signal; and
digital-to-analog converter means responsive to digital output signals produced under the control of said central processing unit to convert said digital signals to corresponding analog signals;
said central processing unit produced digital output signals being predeterminedly related to said instantaneous stored analog levels such that said digital-to-analog converted signals comprise said control signals representative of a commanded bias level.

20. The audio amplifier of claim 19 wherein:
said central processing unit produced digital output signals correspond to a dynamic class A bias signal for use in biasing said first and second symmetrical output pairs such that each output device in the output pair conducts a minimum level bias current above the current being delivered to the load for all input signal levels.

21. The audio amplifier of claim 19 wherein:
said digital memory includes digital data corresponding to the commanded bias level control signals required to bias an individual audio amplifier output stage to a predetermined level.

22. An audio amplifier system comprising:
a gain stage for receiving and amplifying an input signal by a predetermined gain factor;
a load for transducing the output signal from said gain stage;
connecting means for connecting the output of said gain stage to said load; and
feedback means for sensing the differential signal directly applied across the load and producing a feedback signal in response thereto, and applying said feedback signal back to said gain stage as a negative feedback signal.

23. The audio amplifier of claim 22 wherein: said feedback means comprises a differential amplifier having a pair of differential inputs connected to said load, with the output of said differential amplifier being used as said feedback signal.

24. An audio amplifier comprising:
a gain stage for amplifying an input signal by a predetermined gain factor;
a power output stage for power amplifying the gain stage amplified input signal;
bias means responsive to a bias control signal to bias said power output stage to a predetermined bias current level; and
bias control means for producing a bias control signal, said bias control signal being a predetermined function of said input signal prior to said input signal being passed to said power output stage.

25. The audio amplifier of claim 24 wherein:
said bias control means comprises:
(a) means for setting a static bias level;
(b) means responsive to the level of the input signal to produce a dynamic bias level; and
(c) means for combining said static and dynamic bias levels to produce said bias control signal.

26. The audio amplifier of claim 25 wherein:
said bias control signal is produced such that said power output stage is biased for dynamic class A operation such that each output device in said power output stage conducts a minimum level bias current for all input signal levels.

27. The audio amplifier of claim 24 wherein said bias control means comprises:
(a) an absolute value detector for producing a dynamic bias signal related to the absolute value of the input signal;
(b) a fixed bias means for producing a static bias signal; and
(c) summing circuit means for producing said bias control signal as the sum of said dynamic bias signal and said static bias signal.

28. The audio amplifier of claim 24 wherein:
said bias control signal is coupled to said bias means through an optical coupler.

29. The audio amplifier of claim 24 wherein said bias control means comprises:
processing means for:
(a) converting instantaneous analog values of said input signals into corresponding digital; signals;

(b) predeterminedly processing said digital signals to produce an output digital signal representative of a desired bias control signal; and (c) converting said output digital signal into a corresponding bias control signal.

30. The audio amplifier of claim 29 wherein said processing means further comprises:

means for storing data signals representative of the bias control signals required to bias a particular power output stage to a predetermined level.

31. The audio amplifier of claim 24 wherein said bias control means comprises:

memory means for storing digital commands and data;

processing means responsive to said memory means for executing successive commands;

sample and hold means responsive to said processing means for storing instantaneous analog levels of said input signal;

analog-to-digital converter means responsive to said processing means for converting said stored analog levels to corresponding digital signals;

said processing means including means responsive to said memory means and said analog-to-digital converter means produced digital signals for producing predetermined control digital signals in response thereto, and digital-to-converter means for converting said control digital signals into analog bias control signals.

32. The audio amplifier of claim 31 wherein:

said processing means produced control digital signals correspond to dynamic class A bias signals for use in biasing said power output stage such that each output device in said power output stage conducts a minimum level bias current for all input signal levels.

33. The audio amplifier of claim 31 wherein:

said memory means includes digital data corresponding to empirical bias control signal levels required to bias an individual power output stage to a predetermined bias level.

34. The audio amplifier of claim 31 wherein:

said bias control signal is coupled to said bias means through an optical coupler.

* * * * *